(12) United States Patent
Chang et al.

(10) Patent No.: US 12,532,523 B2
(45) Date of Patent: Jan. 20, 2026

(54) SEMICONDUCTOR DEVICES WITH MODULATED GATE STRUCTURES

(71) Applicant: Taiwan Semiconductor Manufacturing Company, Ltd., Hsinchu (TW)

(72) Inventors: Hsiao-Chun Chang, Hsinchu (TW); Guan-Jie Shen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 799 days.

(21) Appl. No.: 17/455,242

(22) Filed: Nov. 17, 2021

(65) Prior Publication Data

US 2022/0359717 A1 Nov. 10, 2022

Related U.S. Application Data

(60) Provisional application No. 63/185,532, filed on May 7, 2021.

(51) Int. Cl.
| | |
|---|---|
| *H10D 64/01* | (2025.01) |
| *H01L 21/02* | (2006.01) |
| *H01L 21/28* | (2006.01) |
| *H01L 21/3213* | (2006.01) |
| *H10D 30/01* | (2025.01) |

(Continued)

(52) U.S. Cl.
CPC ....... *H10D 64/017* (2025.01); *H01L 21/0259* (2013.01); *H01L 21/28088* (2013.01); *H01L 21/32137* (2013.01); *H01L 21/32139* (2013.01); *H10D 30/024* (2025.01); *H10D 30/031* (2025.01); *H10D 30/6211* (2025.01); *H10D 30/6713* (2025.01); *H10D 30/6735* (2025.01); *H10D 30/6739* (2025.01); *H10D 30/6757* (2025.01); *H10D 62/118* (2025.01); *H10D 62/151* (2025.01); *H10D 64/018* (2025.01)

(58) Field of Classification Search
None
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |

(Continued)

*Primary Examiner* — Bradley Smith
(74) *Attorney, Agent, or Firm* — Sterne, Kessler, Goldstein & Fox P.L.L.C.

(57) ABSTRACT

The present disclosure describes a semiconductor device with modulated gate structures and a method for forming the same. The method includes forming a fin structure, depositing a polysilicon layer over the fin structure, and forming a photoresist mask layer on the polysilicon layer. The method further includes etching, with a first etching condition, the polysilicon layer not covered by the photoresist mask layer and above a top surface of the fin structure. The method further includes etching, with a second etching condition, the polysilicon layer not covered by the photoresist mask layer and below the top surface of the fin structure, where the etched polysilicon layer below the top surface of the fin structure is narrower than the etched polysilicon layer above the top surface of the fin structure. The method further includes removing the etched polysilicon layer to form a space and forming a gate structure in the space.

20 Claims, 15 Drawing Sheets

(51) Int. Cl.
*H10D 30/62* (2025.01)
*H10D 30/67* (2025.01)
*H10D 62/10* (2025.01)
*H10D 62/13* (2025.01)

(56) References Cited

U.S. PATENT DOCUMENTS

| | | |
|---|---|---|
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2019/0371915 A1* | 12/2019 | Liao .................. H10D 84/0158 |
| 2020/0105902 A1* | 4/2020 | Ching ................. H10D 62/115 |

* cited by examiner

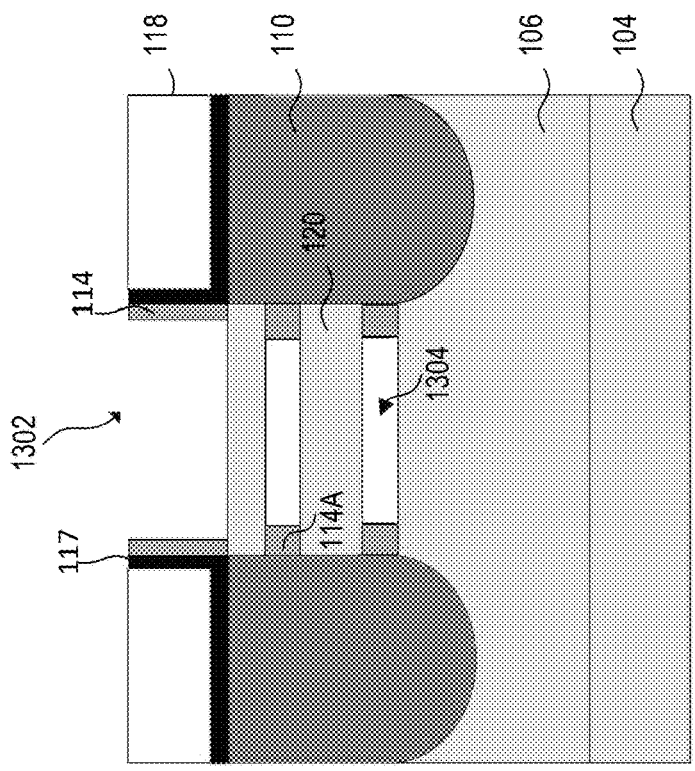
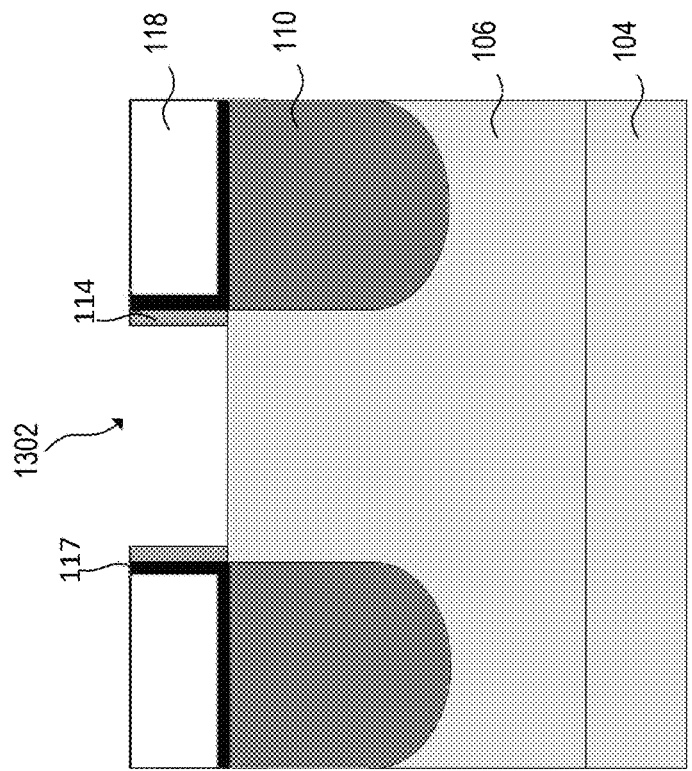
FIG. 13B
FIG. 13A

SEMICONDUCTOR DEVICES WITH MODULATED GATE STRUCTURES

CROSS-REFERENCE TO RELATED APPLICATION

This application claims the benefit of U.S. Provisional Patent Application No. 63/185,532, filed on May 7, 2021 and titled "The Novel Poly-Modulation-Self-Aligned S/D Junction Structure for Isof/DIBL Reduction," the disclosure of which is incorporated by reference herein in its entirety.

BACKGROUND

With advances in semiconductor technology, there have been increasing demands for higher storage capacity, faster processing systems, higher performance, and lower costs. To meet these demands, the semiconductor industry continues to scale down the dimensions of semiconductor devices with three-dimensional transistors, such as gate-all-around (GAA) field effect transistors (FETs) and fin field effect transistors (finFETs).

BRIEF DESCRIPTION OF THE DRAWINGS

Aspects of the present disclosure are best understood from the following detailed description when read with the accompanying figures.

FIGS. 3A-14B illustrate cross-sectional views of a semiconductor device with modulated gate structures at various stages of its fabrication process, in accordance with some embodiments.

DETAILED DESCRIPTION

Figure 1A:
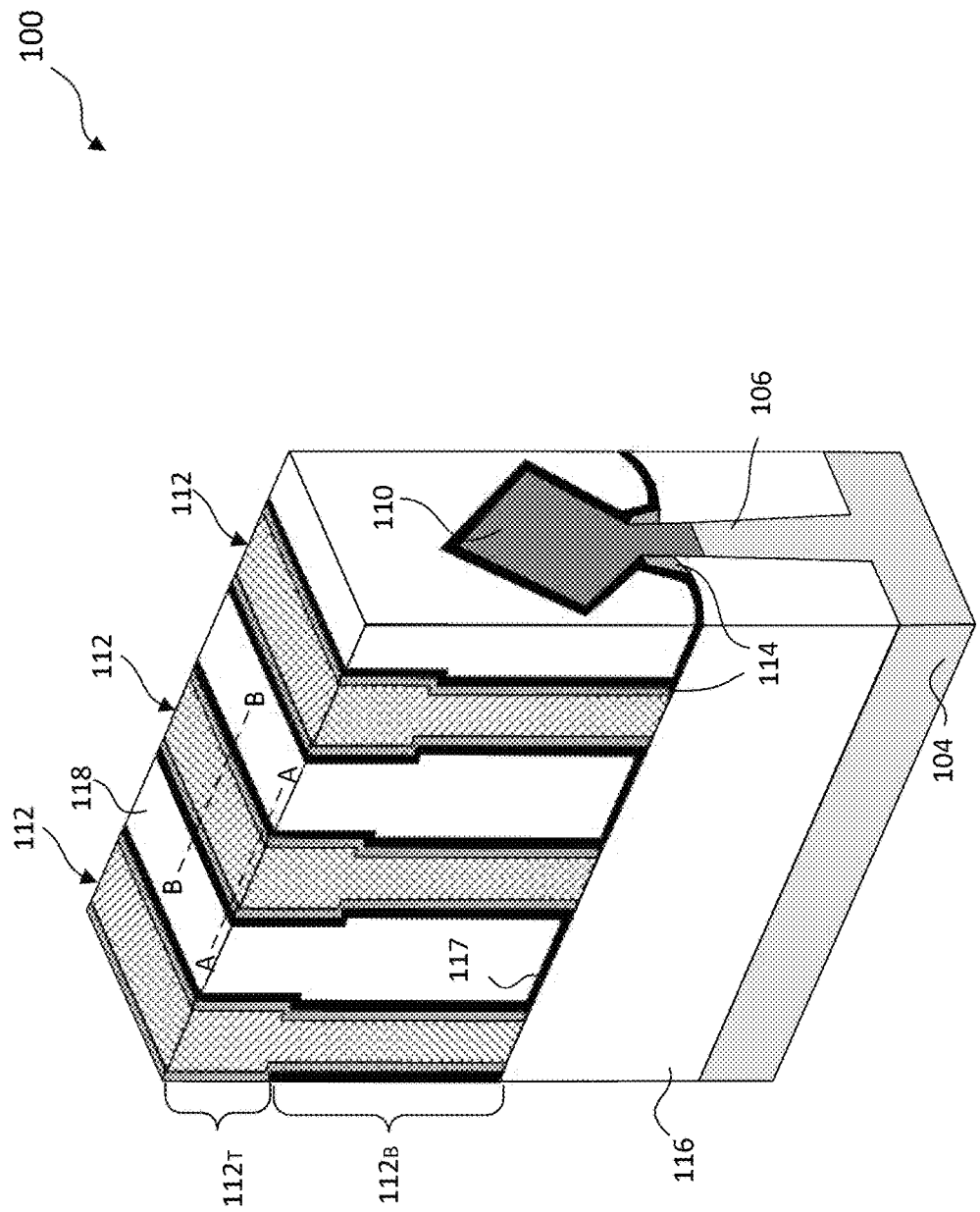
FIGS. 1A-1E illustrate isometric views of a semiconductor device with modulated gate structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1A-1E and 3A-14B with the same annotations applies to each other, unless mentioned otherwise.

As the semiconductor industry continues to scale down the dimensions of semiconductor devices, circuit complexity has increased at all device levels. Gate-all-around (GAA) field effect transistors (FETs) and fin field effect transistors (finFETs) increase device density and improve device performance. GAA FETs and finFETs include a pair of source/drain (S/D) regions formed on opposite sides of a channel region and a gate structure formed on the channel region. Scaling down the dimensions of semiconductor devices can increase leakage current between S/D regions. For example, beyond the 5 nm technology node or the 3 nm technology node, increased S/D tunneling can increase leakage current, such as off source current (Isof), and cause device failure. Short channel effects (SCEs) can also be one of the reasons for device failure. For example, SCEs can cause drain induced barrier lowering (DIBL). As devices scale down, distance between S/D regions and gate structures decreases. Gate-to-channel capacitance (Cgc) and gate-to-drain capacitance (Cgd) increase, resulting in slower device speed. Spacer thickness can be increased to extend distance between S/D regions and gate structures. However, thicker spacers can decrease work function metal (WFM) gate fill and cause S/D under etching issues. Semiconductor devices implementing nanostructures, such as nanowires and nanosheets, can overcome the SCEs. For example, GAA FETs can reduce SCEs and enhance carrier mobility, which in turn improve device performance. However, it has become increasingly challenging to further reduce leakage paths between the pair of S/D regions and reduce Cgc and Cgd. Leakage current flowing through the S/D regions can impact off current. Cgc and Cgd can impact device speed. Both leakage current and parasitic capacitances reduce device performance.

The present disclosure provides example FET devices (e.g., GAA FETs, finFETs, or planar FETs) with modulated gate structures in a semiconductor device and/or in an integrated circuit (IC) and an example method for fabricating the same. The modulated gate structures can be gate structures having varying lengths at different portions. For example, a first portion of the modulated gate structure above a top surface of a fin structure can be wider than a second portion of the modulated gate structure below the top surface of the fin structure. In some embodiments, a polysilicon layer can be blanket deposited on the fin structure. A photoresist mask layer can be formed on the polysilicon layer. The polysilicon layer not covered by the photoresist mask layer and above the top surface of the fin structure can be etched using a first etching condition. The polysilicon layer not covered by the photoresist mask layer and below the top surface of the fin structure can be etched using a second etching condition. The different etching conditions can result in a narrower etched polysilicon layer below the fin top surface than the etched polysilicon layer above the fin top surface. A spacer can be formed on the etched polysilicon layer. S/D regions can be formed aligning to the spacer above the fin top surface. The etched polysilicon layer can be removed to form a space and the modulated gate structure can be formed in the space. Because S/D regions are aligned to the spacer above the fin top surface and the modulated gate structure is narrower below the fin top surface than above the fin top surface, the distance between the S/D regions and the modulated gate structure below the fin top surface is extended. Leakage current can be reduced, resulting in a more reliable device. Cgc and Cgd can also be reduced, resulting in faster device speed. The modulated gate structure process can also be performed on fin structures with first-type nanostructures and second-type nanostructures.

Figure 1C:
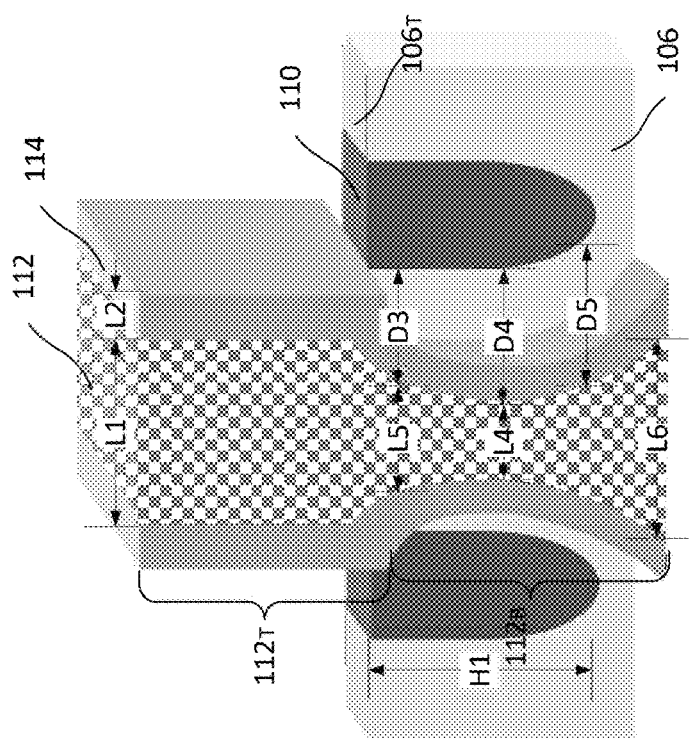
Figure 1B:
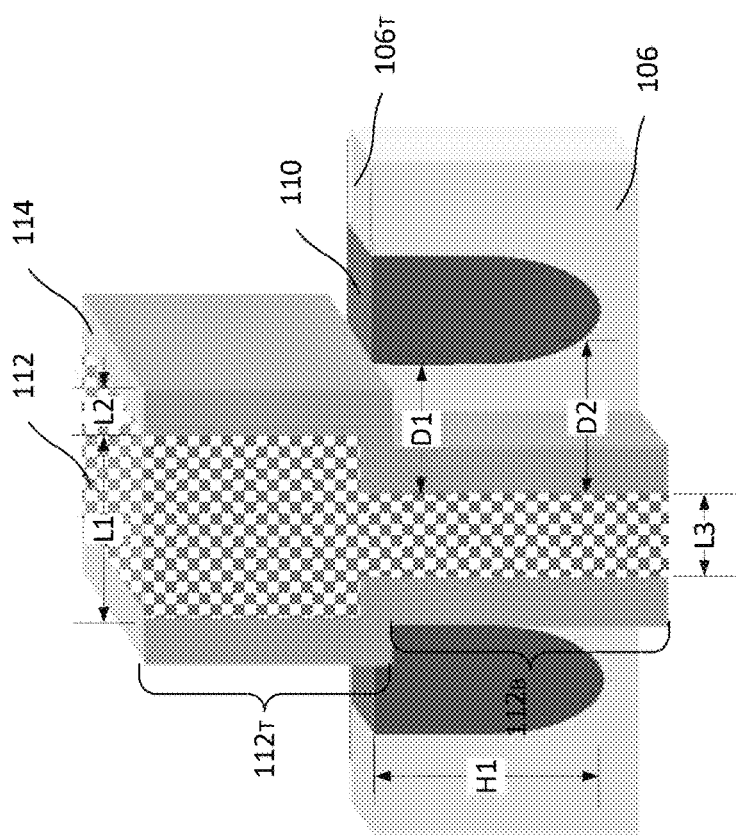
Figures 1D, 1E:
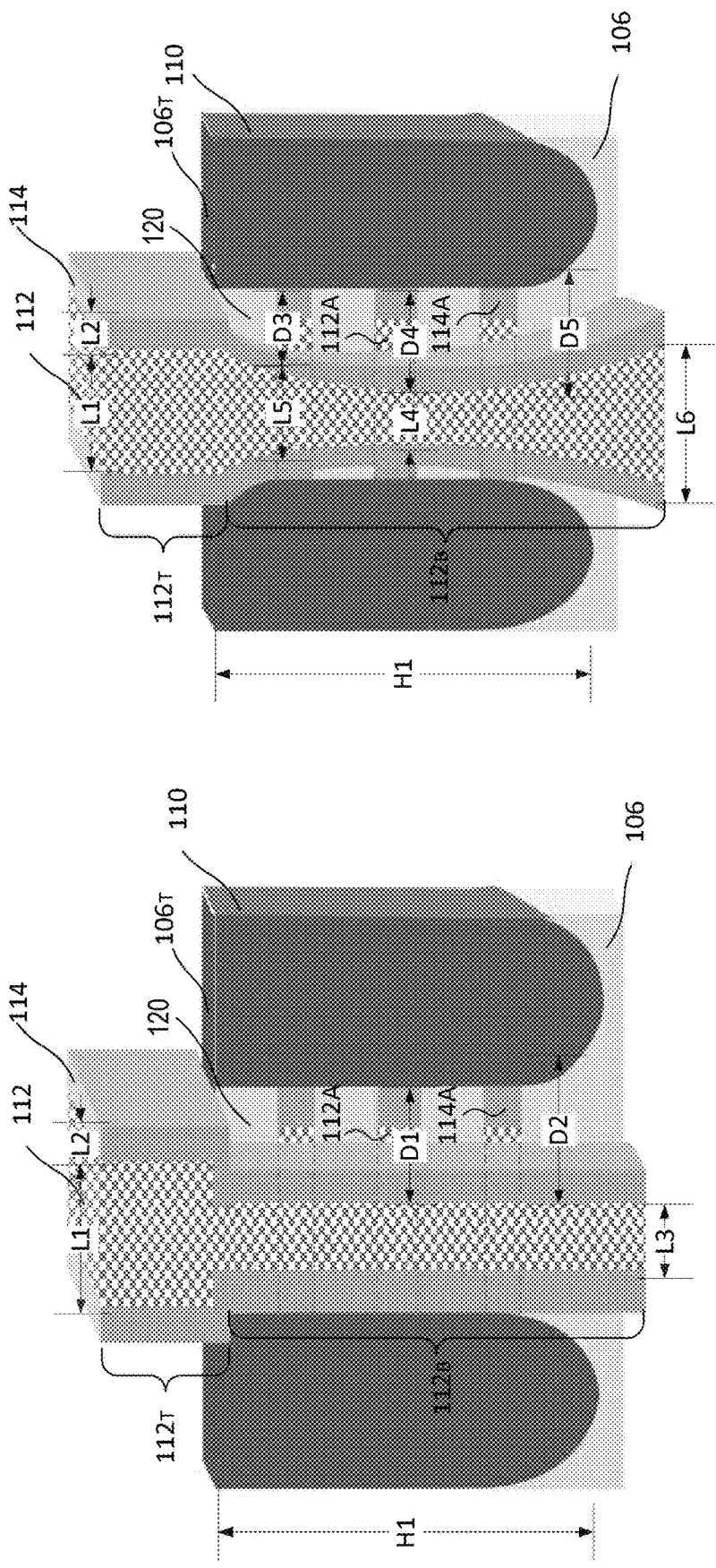

According to some embodiments, FIG. 1A illustrates an isometric view of a FET 100. In some embodiments, FET 100 can represent a finFET 100 or a GAA FET 100. In some embodiments, FET 100 can represent n-type FET 100 (NFET 100) or p-type FET 100 (PFET 100) and the discussion of FET 100 applies to both NFET 100 and PFET 100, unless mentioned otherwise. FIGS. 1B and 1C illustrate isometric views of finFET 100 showing relative positions between S/D regions 110 and modulated gate structures 112. FIGS. 1D and 1E illustrate isometric views of GAA FET 100 showing relative positions between S/D regions 110 and modulated gate structures 112 and 112A. The discussion of elements in FIGS. 1A-1E with the same annotations applies to each other, unless mentioned otherwise.

Referring to FIGS. 1A-1C, finFET 100 can include modulated gate structures 112 disposed on fin structures 106. Modulated gate structures 112 can include top gate structures $112_T$ and bottom gate structures $112_B$. Referring to FIGS. 1A, 1D, and 1E, GAA FET 100 can include gate structures 112 and 112A (only modulated gate structures 112 are visible in FIG. 1A; gate layers 112A visible in FIGS. 1D and 1E) disposed on fin structures 106. Referring to FIGS. 1A-1E, FET 100 can include S/D regions 110 disposed on portions of fin structures 106 that are not covered by modulated gate structures 112. FET 100 can further include gate spacers 114 and shallow trench isolation (STI) regions 116. FET 100 can further include etch stop layers (ESLs) 117 and interlayer dielectric (ILD) layers 118. ILD layers 118 can be disposed on ESLs 117. Referring to FIGS. 1D and 1E, GAA FET 100 can further include inner spacers 114A. In some embodiments, gate spacers 114, inner spacers 114A, STI regions 116, ESLs 117, and ILD layers 118 can include an insulating material, such as silicon oxide ($SiO_x$), silicon nitride (SiN), silicon carbon nitride (SiCN), silicon oxycarbon nitride (SiOCN), and silicon germanium oxide ($SiGeO_x$). In some embodiments, gate spacers 114 and inner spacers 114A can have a thickness L2 of about 2 nm to about 9 nm for adequate electrical isolation of gate structures 112 and 112A from adjacent structures.

Referring to FIG. 1A, FET 100 can be formed on a substrate 104. There can be other FETs and/or structures (e.g., isolation structures) formed on substrate 104. Substrate 104 can be a semiconductor material, such as silicon (Si), germanium (Ge), silicon germanium (SiGe), a silicon-on-insulator (SOI) structure, and a combination thereof. Further, substrate 104 can be doped with p-type dopants, such as boron (B), indium (In), aluminum (Al), and gallium (Ga), or n-type dopants, such as phosphorous (P) and arsenic (As). In some embodiments, fin structures 106 can include a material similar to substrate 104 and extend along an X-axis.

Referring to FIGS. 1A-1E, in some embodiments, gate structures 112 and 112A can be multi-layered structures. The multi-layers of gate structures 112 and 112A are not shown in FIGS. 1A-1E for simplicity. Each of gate structures 112 and 112A can include an interfacial oxide (IO) layer, a high-k (HK) gate dielectric layer disposed on IO layer, and a conductive layer disposed on the HK gate dielectric layer. The IO layers can include $SiO_x$, $SiGeO_x$, or germanium oxide ($GeO_x$). The HK gate dielectric layers can include an HK dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). The conductive layers can be multi-layered structures. Each of the conductive layers can include a WFM layer disposed on the HK gate dielectric layer, and a gate metal fill layer on the WFM layer. In some embodiments, the WFM layers can include titanium aluminum (TiAl), titanium aluminum carbide (TiAlC), tantalum aluminum (TaAl), tantalum aluminum carbide (TaAlC), Al-doped titanium (Ti), Al-doped titanium nitride (TiN), Al-doped tantalum (Ta), Al-doped tantalum nitride (TaN), other suitable Al-based materials, and a combination thereof. In some embodiments, the WFM layers can include substantially Al-free (e.g., with no Al) Ti-based or Ta-based nitrides or alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu), and a combination thereof. The gate metal fill layers can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Referring to FIGS. 1A-1E, for NFET 100, each of S/D regions 110 can include an epitaxially-grown semiconductor material, such as Si and SiGe, and n-type dopants, such as P and other suitable n-type dopants. For PFET 100, each of S/D regions 110 can include an epitaxially-grown semiconductor material, such as Si and SiGe, and p-type dopants, such as B and other suitable p-type dopants. A dopant concentration can be in a range from about $1 \times 10^{20}$ atoms/$cm^3$ to about $3 \times 10^{22}$ atoms/$cm^3$ in each of S/D regions 110. In some embodiments, S/D regions 110 can have a depth H1 of about 50 nm to about 70 nm.

Referring to FIGS. 1D-1E, in some embodiments, FET 100 can include second-type nanostructures 120. Second-type nanostructures 120 can include a semiconductor material, similar to or different from substrate 104. Second-type nanostructures 120 can include a semiconductor material, similar to fin structure 106 and S/D regions 110. In some embodiments, second-type nanostructures 120 can include Si, silicon arsenide (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, or other suitable semiconductor materials. Second-type nanostructures 120 can be nanosheets or nanowires. Second-type nanostructures 120 can have cross-sections of other geometric shapes, such as circular, elliptical, triangular, and polygonal shapes.

Referring to FIGS. 1B and 1D, bottom gate structure $112_B$ below fin top surface $106_T$ can have substantially straight sidewalls. Top gate structure $112_T$ above fin top surface $106_T$ can have a length L1 between about 5 nm and about 30 nm, between about 10 nm and about 25 nm, and between about 15 nm and about 20 nm. L1 can be similar to a gate length of a gate structure that does not have a modulated arrangement. Bottom gate structure $112_B$ can have a length L3 between about 3 nm and about 20 nm, between about 4 nm and about 15 nm, and between about 5 nm and about 10 nm. If L3 is greater than about 20 nm, the leakage reduction effect and capacitance reduction effect can be insufficient. For example, the leakage reduction effect can be considered insufficient if Isof exceeds a threshold amount. The capacitance reduction effect can be considered insufficient if Cgc and Cgd exceed a threshold amount. If L3 is less than about 3 nm, gate control can be insensitive. For example, gate control can be considered insensitive if an inversion layer is not formed or on current is degraded. A ratio between L1 and L3 can be between about 1.3 and about 5, between about 1.4 and about 4, and between about 1.5 and about 3. If the ratio L1/L3 is less than about 1.3, the leakage reduction effect and capacitance reduction effect can be insufficient. If the ratio L1/L3 is greater than about 5, gate control can be insensitive. Distance D1 between a side surface of a top portion of S/D regions 110 and an adjacent side surface of bottom gate structure 112E can be between about 3 nm and about 15 nm, between about 4 nm and about 12 nm, and between about 5 nm and about 10 nm. Distance D2 between a side surface of a bottom portion of S/D regions 110 and an adjacent side surface of bottom gate structure 112E can be between about 3 nm and about 17 nm, between about 4 nm and about 14 nm, and between about 5 nm and about 12 nm. If D1 or D2 is less than about 3 nm, the leakage reduction effect and capacitance reduction effect can be insufficient. If D1 is greater than about 15 nm or D2 is greater than about 17 nm, gate control can be insensitive.

Referring to FIGS. 1C and 1E, bottom gate structure 112E below fin top surface $106_T$ can have curved sidewalls. Top gate structure $112_T$ above fin top surface $106_T$ can have a length L1 between about 5 nm and about 30 nm, between about 10 nm and about 25 nm, and between about 15 nm and about 20 nm. L1 can be similar to a gate length of a gate structure that does not have a modulated arrangement. Wider portions of bottom gate structure 112E can have lengths L5 and L6 between about 5 nm and about 30 nm, between about 10 nm and about 25 nm, and between about 15 nm and about 20 nm. L5 and L6 can be similar to or smaller than L1. L5 can be similar to or different than L6. The narrowest portion of bottom gate structure 112E can have a length L4 between about 3 nm and about 20 nm, between about 4 nm and about 15 nm, and between about 5 nm and about 10 nm. If L4 is greater than about 20 nm, the leakage reduction effect and capacitance reduction effect can be insufficient. If L4 is less than about 3 nm, gate control can be insensitive. A ratio between L4 and L1 can be between about 1.3 and about 5, between about 1.4 and about 4, and between about 1.5 and about 3. If the ratio L1/L4 is less than about 1.3, the leakage reduction effect and capacitance reduction effect can be insufficient. If the ratio L1/L4 is greater than about 5, gate control can be insensitive. Distance D3 between a side surface of a top portion of S/D regions 110 and an adjacent side surface of bottom gate structure 112E can be between about 3 nm and about 14 nm, between about 4 nm and about 11 nm, and between about 5 nm and about 9 nm. Distance D4 between a side surface of a middle portion of S/D regions 110 and an adjacent side surface of bottom gate structure 112E can be between about 3 nm and about 15 nm, between about 4 nm and about 12 nm, and between about 5 nm and about 10 nm. Distance D5 between a side surface of a bottom portion of the bottom of S/D regions 110 and an adjacent side surface of bottom gate structure 112E can be between about 3 nm and about 17 nm, between about 4 nm and about 14 nm, and between about 5 nm and about 12 nm. If D3, D4, or D5 is less than about 3 nm, the leakage reduction effect and capacitance reduction effect can be insufficient. If D3 is greater than about 14 nm, D4 is greater than about 15 nm, or D5 is greater than about 17 nm, gate control can be insensitive.

Referring to FIGS. 1A-1E, bottom gate structure $112_B$ below fin top surface $106_T$ can have sidewalls with other shapes, such as wavy and serrated shapes. As long as bottom gate structure $112_B$ is narrower than top gate structure $112_T$, the leakage and capacitance reduction can be achieved, according to some embodiments.

Figure 2:
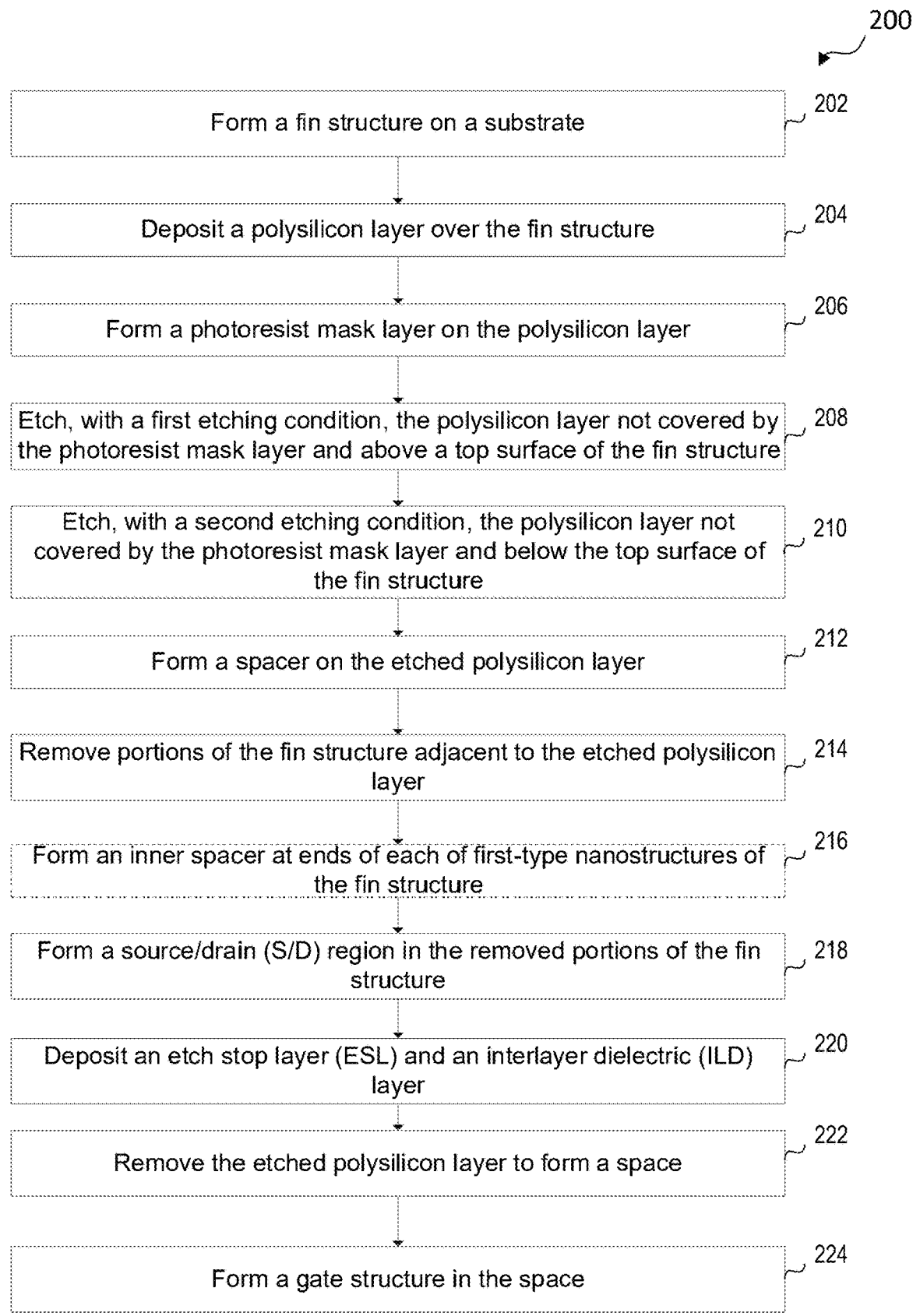
FIG. 2 is a flow diagram of a method for fabricating a semiconductor device with modulated gate structures, in accordance with some embodiments.

According to some embodiments, FIG. 2 is a flow diagram describing a method 200 for fabricating FET 100, as shown in FIGS. 1A-1E. For illustrative purposes, the operations illustrated in FIG. 2 will be described with reference to the example fabrication process for fabricating FET 100 as illustrated in FIGS. 3A-14B. FIGS. 4-7 are cross-sectional views of FET 100 along line A-A of FIG. 1A at various stages of fabrication, according to some embodiments. FIGS. 3A, 3B, and 8A-14B are cross-sectional views of FET 100 along line B-B of FIG. 1A at various stages of fabrication, according to some embodiments. Additional fabrication operations can be performed between the various operations of method 200 and can be omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 2. It should be noted that method 200 may not produce a complete FET 100. Accordingly, it is understood that additional processes can be provided before, during, and after method 200, and that some other processes may only be briefly described herein. Elements in FIGS. 3A-14B with the same annotations as elements in FIGS. 1A-1E are described above.

Figure 3B:
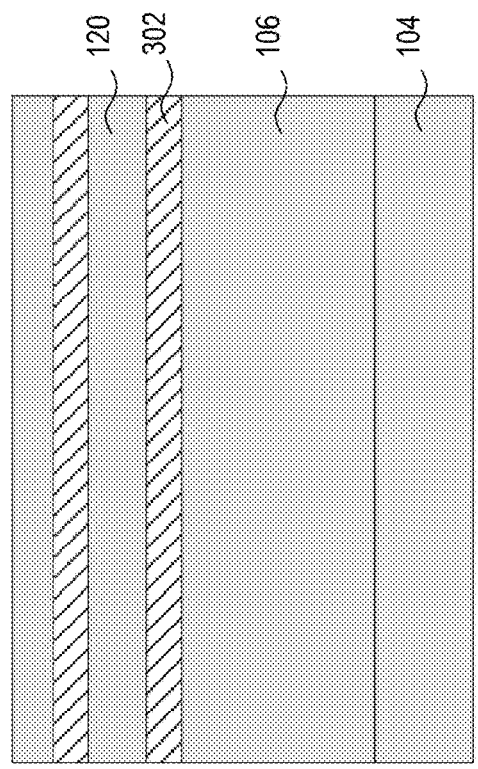
Figure 3B:
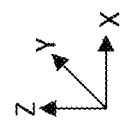
Figure 3A:
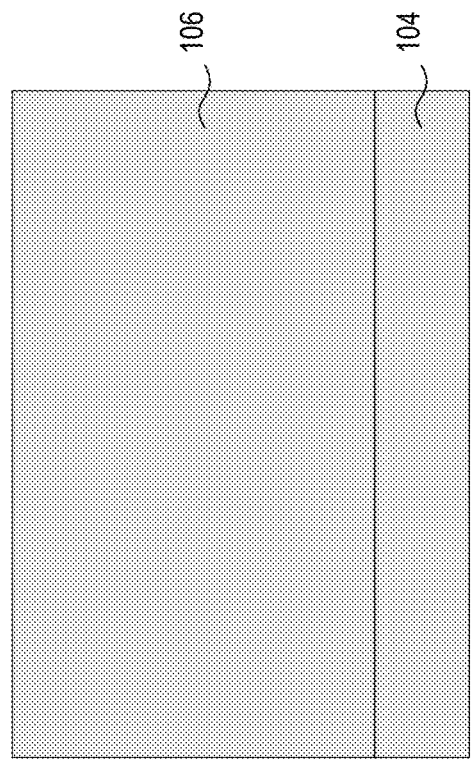
Figure 3A:
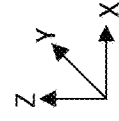

Referring to FIG. 2, in operation 202, a fin structure is formed on a substrate. In some embodiments, the fin structure can be formed with or without first-type nanostructures and second-type nanostructures. For example, as shown in FIG. 3A, fin structure 106 is formed on substrate 104 without first-type nanostructures and second-type nanostructures; as shown in FIG. 3B, fin structure 106 is formed on substrate 104, and fin structure 106 includes first-type nanostructures 302 and second-type nanostructures 120. Fin structure 106 can be patterned by any suitable method. For example, fin structure 106 can be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over substrate 104 and patterned using a photolithography process. Spacers are formed alongside the patterned sacrificial layer using a self-aligned process. The sacrificial layer is then removed, and the remaining spacers may then be used to pattern fin structure 106.

Figure 4:
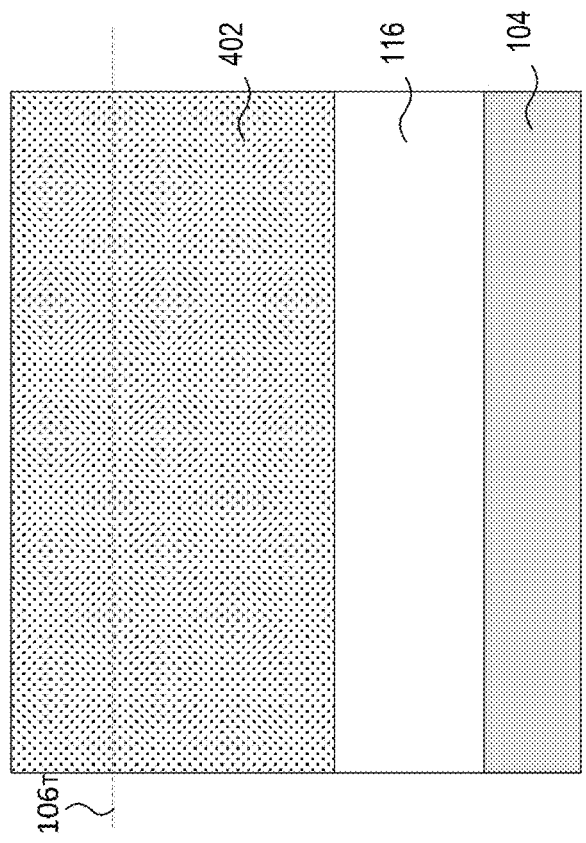

Referring to FIG. 2, in operation 204, a polysilicon layer is deposited on the fin structure. For example, as shown in FIG. 4, polysilicon layer 402 is deposited on fin structure 106 (not visible in FIG. 4) and STI region 116. A top surface of fin structure 106, or fin top surface $106_T$, is indicated. The deposition of polysilicon layer 402 can include blanket depositing a layer of polysilicon material over fin structure 106 using chemical vapor deposition (CVD), physical vapor deposition (PVD), atomic layer deposition (ALD), or other suitable deposition processes.

Figure 5:
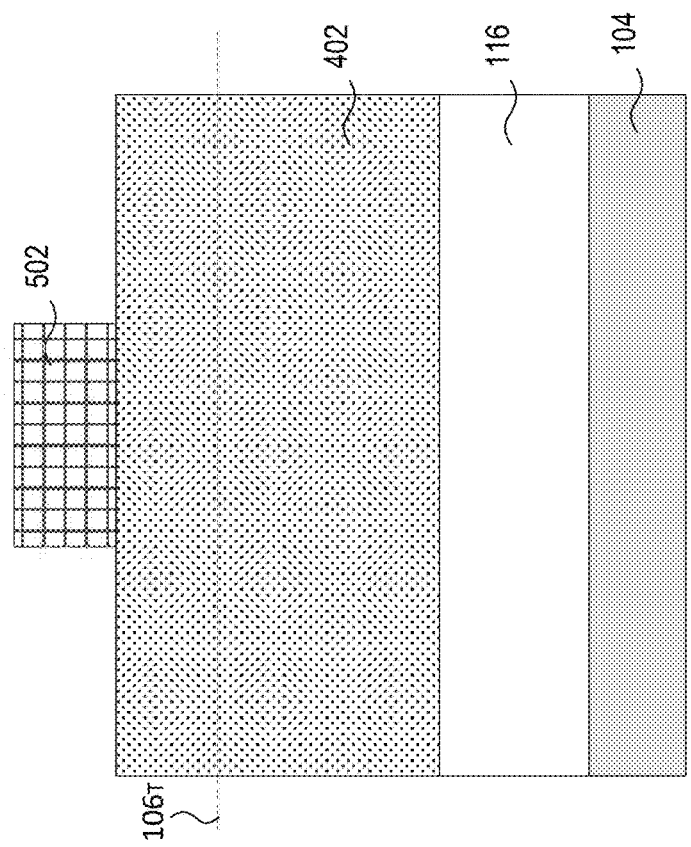

Referring to FIG. 2, in operation 206, a photoresist mask layer is formed on the polysilicon layer. For example, as shown in FIG. 5, photoresist mask layer 502 is formed on polysilicon layer 402. Photoresist mask layer 502 can be formed by a photolithographic patterning process. The photolithographic patterning process can include spin coating a photoresist on polysilicon layer 402, exposing the photoresist with an ultraviolet (UV) or extreme ultraviolet (EUV) radiation source through a reticle (e.g., a photomask), and developing the exposed photoresist.

Figure 6A:
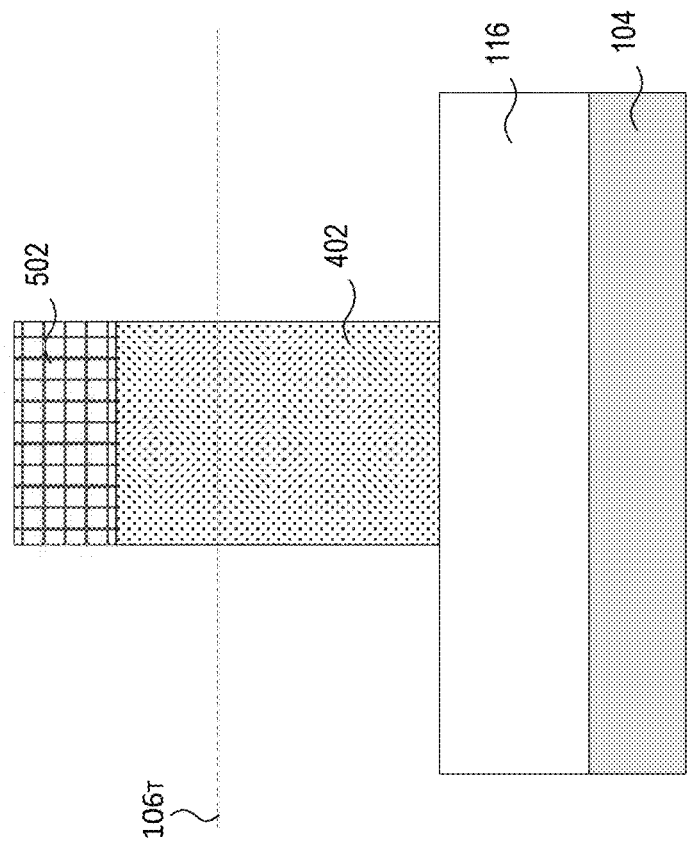
Figure 6B:
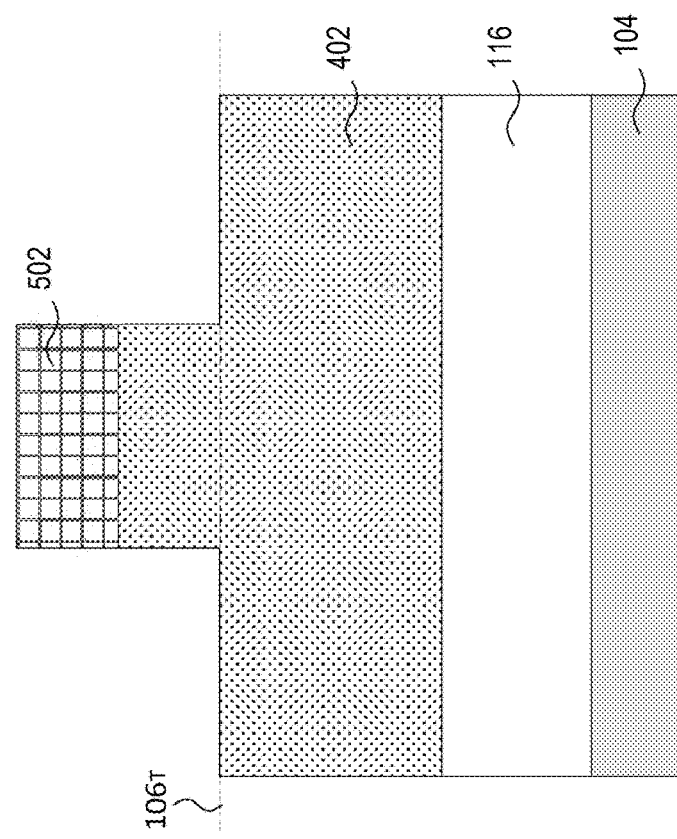

Referring to FIG. 2, in operation 208, the polysilicon layer not covered by the photoresist mask layer and above the fin top surface is etched with a first etching condition. For example, as shown in FIG. 6A, polysilicon layer 402 not covered by photoresist mask layer 502 and above fin top surface $106_T$ is etched with a first etching condition. The etching of polysilicon layer 402 can include a dry etching (e.g., reactive ion etching). The first etching condition can use a gas mixture having fluorocarbon ($C_xF_y$), such as carbon tetrafluoride ($CF_4$), trifluoromethane ($CHF_3$), difluoromethane ($CH_2F_2$), or fluoromethane ($CH_3F$), hydrogen ($H_2$), hydrogen bromide (HBr), and chlorine ($Cl_2$). The gas mixture can include passivation gas nitrogen ($N_2$) and/or oxygen ($O_2$). The gas mixture can include plasma gas helium (He) or argon (Ar). The gas flow for all gases can be between about 1 sccm and about 300 sccm. The gas flow for the passivation gas can be between about 20 sccm and about 100 sccm. The pressure in the etching chamber can range from about 2 mT to about 50 mT. The temperature in the etching chamber can range from about 10° C. and about 50° C. The power of the plasma etching can be between about 10 W and about 500 W. The duration of the dry etching can be between about 1 min and about 10 min. Etching to fin top surface $106_T$ can be a timed etching. After etching reaches fin top surface $106_T$, the etching condition can be tuned such that passivation gas flow is reduced and passivation on the polysilicon layer below fin top surface $106_T$ is reduced. Consequently, etching rate on the polysilicon layer below fin top surface $106_T$ can be increased. Alternatively, as shown in FIG. 6B, polysilicon layer 402 can be etched down to STI region 116 with the first etching condition. Then the etching condition can be tuned such that etching power is increased and there is a lateral etch below fin top surface $106_T$. Both methods can result in the etched polysilicon layer below fin top surface $106_T$ narrower than the etched polysilicon layer above fin top surface $106_T$. In some embodiments, polysilicon layer 402 can be etched with wet etching or selective etching.

Figure 7:
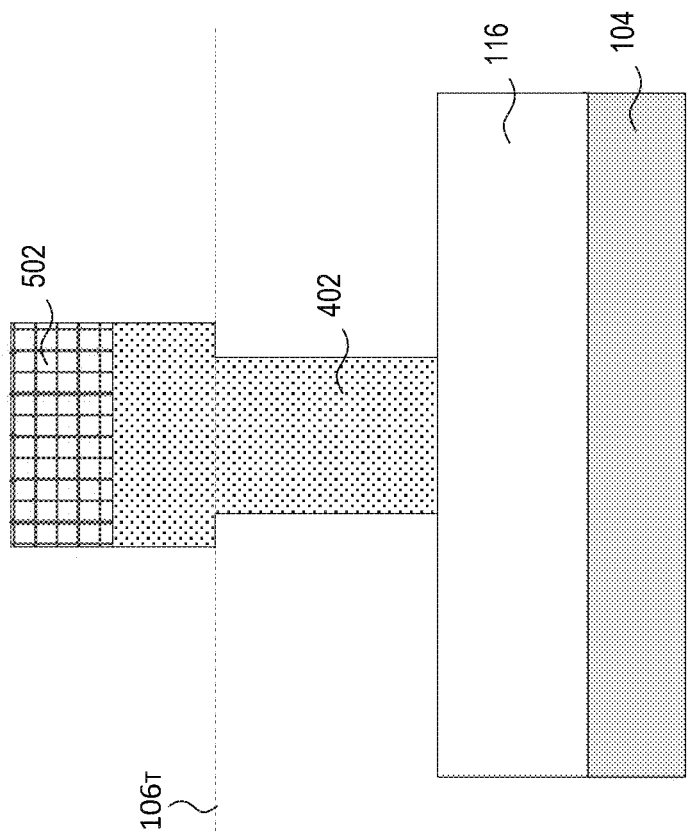

Referring to FIG. 2, in operation 210, the polysilicon layer not covered by the photoresist mask layer and below the fin top surface is etched with a second etching condition. For example, as shown in FIG. 7, polysilicon layer 402 not covered by photoresist mask layer 502 and below fin top surface $106_T$ is etched with a second etching condition. In some embodiments, the etching condition can be tuned by reducing passivation gas flow rate. Reducing the passivation gas flow rate can decrease passivation on the polysilicon layer and increase the etching rate below fin top surface $106_T$. A $N_2/O_2$ assivation gas flow rate can be reduced to be between about 0.5 sccm and about 70 sccm, between about 0.8 sccm and about 60 sccm, and between about 1 sccm and about 50 sccm. If the passivation gas flow rate is greater than about 70 sccm, the leakage reduction effect and capacitance reduction effect can be insufficient. If the passivation gas flow rate is less than about 0.5 sccm, gate control can be insensitive.

In some embodiments, the etching condition can also be tuned by increasing the power of plasma etching. Increasing the power of plasma etching can cause additional lateral etching below fin top surface $106_T$. The power of plasma etching can be increased to be between about 50 W and about 1200 W, between about 80 W and about 1100 W, and between about 100 W and about 1000 W. If the power of plasma etching is less than about 50 W, the leakage reduction effect and capacitance reduction effect can be insufficient. If the power of plasma etching is greater than about 1200 W, gate control can be insensitive. As shown in FIG. 7, both tuning the passivation gas flow rate and tuning the power of plasma etching can result in the etched polysilicon layer below fin top surface $106_T$ narrower than the etched polysilicon layer above fin top surface $106_T$. After the etched polysilicon layer is formed, photoresist mask layer 502 can be removed by etching or stripping.

In some embodiments, the modulated polysilicon structure can be formed in an additive manner. In other words, a narrower polysilicon structure below fin top surface $106_T$ can be formed using a first deposition condition or a first pattern, and a wider polysilicon structure above fin top surface $106_T$ can be formed using a second deposition condition or a second pattern. The modulated polysilicon structure can be replaced by modulated gate structures as described below. The modulated gate structures can reduce Isof, DIBL, Cgc, and Cgd, which in turn reduce device failures, increase device reliability, increase device speed, and improve device performance.

Figure 8B:
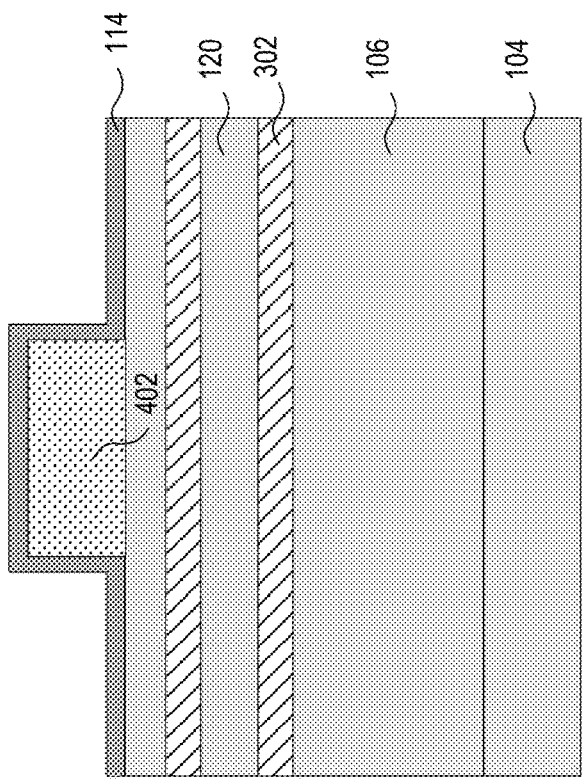
Figure 8A:
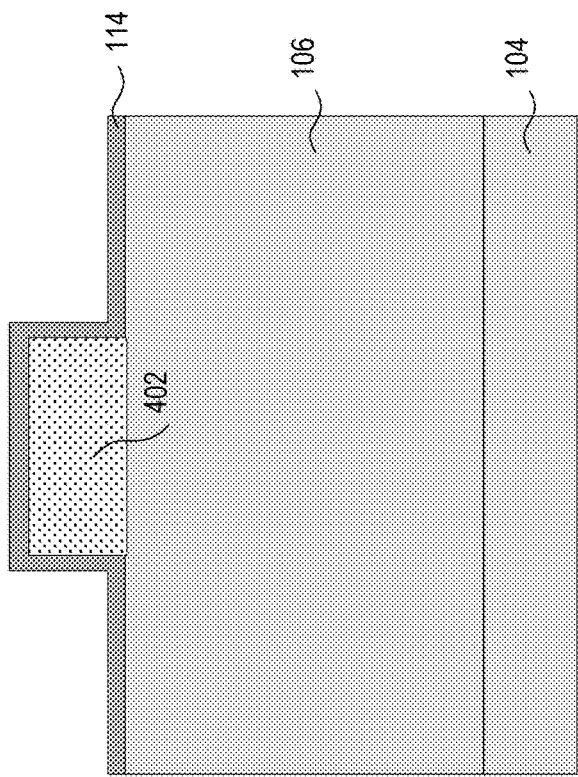

Referring to FIG. 2, in operation 212, a spacer is formed on the etched polysilicon layer. For example, as shown in FIGS. 8A and 8B, spacer 114 is formed on etched polysilicon layer 402. The formation of spacer 114 can include blanket depositing a layer of an insulating material (e.g., an oxide or a nitride material) over fin structure 106 and etched polysilicon layer 402 by a CVD, a PVD, or an ALD process followed by an etching process (e.g., reactive ion etching or other dry etching process using a chlorine (Cl) or fluorine (F) based etchant).

Figure 9B:
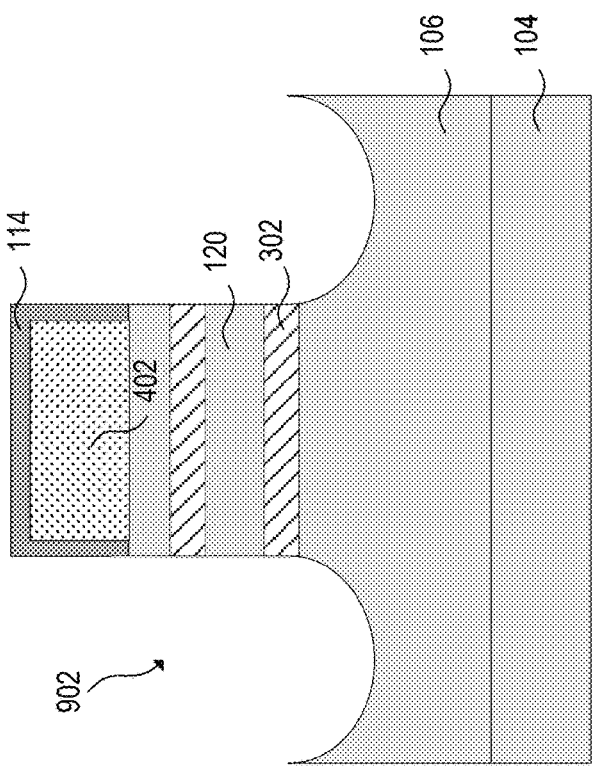
Figure 9A:
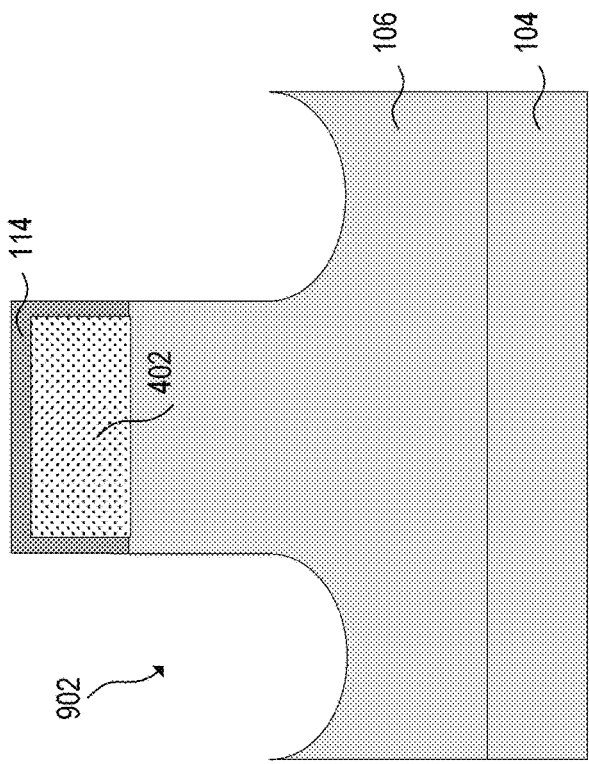

Referring to FIG. 2, in operation 214, portions of the fin structure adjacent to the etched polysilicon layer are removed. For example, as shown in FIGS. 9A and 9B, portions of fin structure 106 adjacent to etched polysilicon layer 402 are removed to form recess openings 902. Recess openings 902 can be formed by a dry etching process (e.g., reactive ion etching process). The dry etching process can use a gas mixture having $C_xF_y$, $N_2$, and Ar. Recess openings 902 can be formed by a wet etching process, additionally and/or alternatively. The wet etching process can include a diluted solution of hydrofluoric acid (HF) with a buffer, such as ammonium fluoride ($NH_4F$), diluted HF ($HF/H_2O$), phosphoric acid ($H_3PO_4$), sulfuric acid with deionized water ($H_2SO_4/H_2O$), and a combination thereof. The etching process can be a selective etching or a timed etching.

Figure 10:
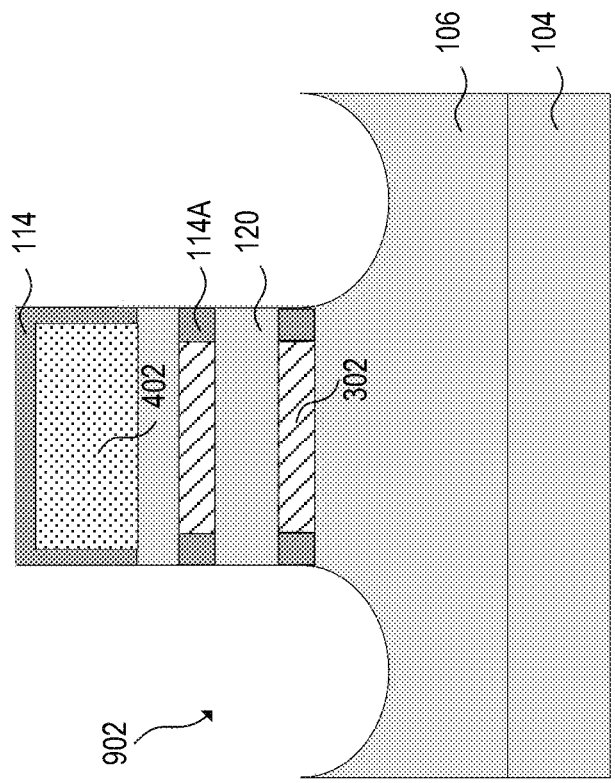

Referring to FIG. 2, in operation 216, for the fin structure that includes the first-type nanostructures and the second-type nanostructures, an inner spacer is formed at ends of each of the first-type nanostructures. For example, as shown in FIG. 10, inner spacers 114A are formed at ends of each of first-type nanostructure 302. The formation of inner spacers 114A can include first laterally recessing the ends of first-type nanostructure 302. The lateral recess process can be a dry etching process, a wet etching process, and a combination thereof, each having a higher etching selectivity towards first-type nanostructure 302 than second-type nanostructure 120. The laterally recessed ends of first-type nanostructure 302 can then be filled with a dielectric material using CVD or ALD.

Figure 11B:
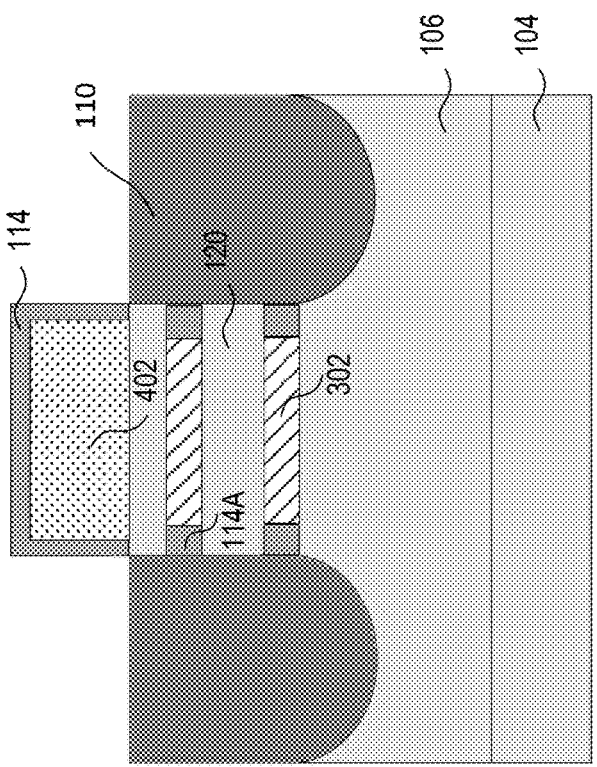
Figure 11A:
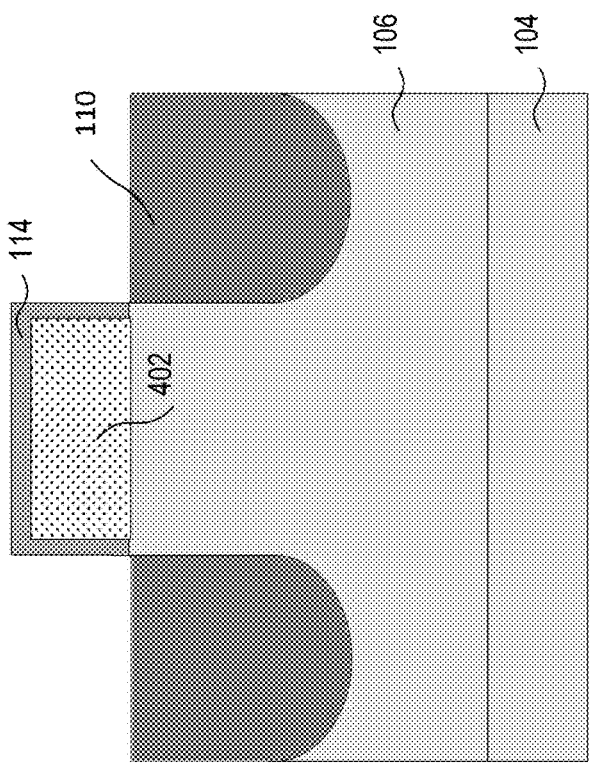

Referring to FIG. 2, in operation 218, an S/D region is formed in the removed portions of the fin structure, and the S/D region can be doped. For example, as shown in FIGS. 11A and 11B, S/D regions 110 are formed on opposite sides of etched polysilicon layer 402 in recess openings 902. By way of example and not limitation, S/D regions 110 can be epitaxially grown using source gases, such as silane ($SiH_4$), silicon tetrachloride ($SiCl_4$), trichlorosilane (TCS), and dichlorosilane ($SiH_2Cl_2$ or DSC). Hydrogen ($H_2$) can be used as a reactant gas to reduce the aforementioned source gases. For example, $H_2$ can combine with Cl to form hydrogen chloride (HCl), leaving Si to epitaxially grow in S/D regions 110. The growth temperature during the epitaxial growth can range from about 700° C. to about 1250° C. depending on the gases used. According to some embodiments, S/D regions 110 can have the same crystallographic orientation as substrate 104 or fin structures 106 since substrate 104 or fin structures 106 can act as a seed layer for S/D regions 110. In some embodiments, a top surface of S/D regions 110 can be parallel to the (100) crystal plane. S/D regions 110 can be in-situ doped during their epitaxial growth process using p-type dopants, such as B, In, and Ga, or n-type dopants, such as P and As. For p-type in-situ doping, p-type doping precursors, such as diborane ($B_2H_6$), boron trifluoride ($BF_3$), and other p-type doping precursors can be used. For n-type in-situ doping, n-type doping precursors, such as phosphine ($PH_3$), arsine ($AsH_3$), and other n-type doping precursor can be used.

Figure 12B:
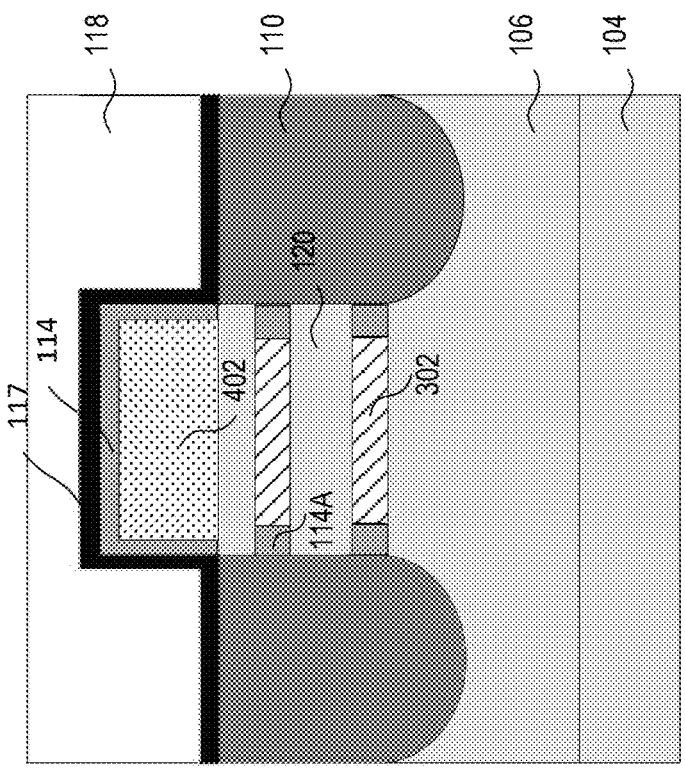
Figure 12A:
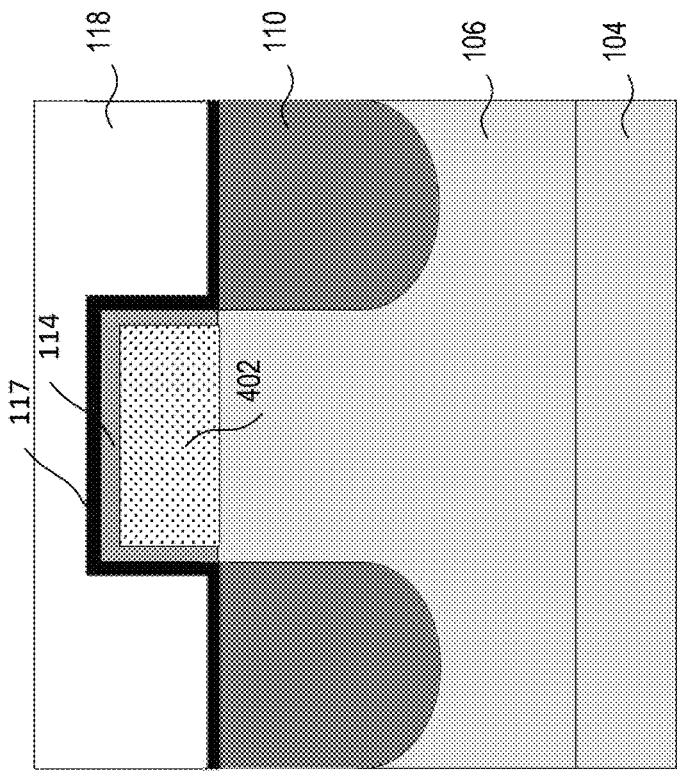

Referring to FIG. 2, in operation 220, an ESL and an ILD layer can be deposited on the spacer and on the S/D regions. For example, as shown in FIGS. 12A and 12B, ESL 117 and ILD layer 118 are deposited on spacer 114 and S/D regions 110. ESL 117 and ILD layer 118 can be insulating materials deposited using PVD, CVD, or plasma-enhanced chemical vapor deposition (PECVD). In some embodiments, a chemical mechanical polishing/planarization (CMP) process can follow the deposition of ESL 117 and ILD layer 118, such that etched polysilicon layer 402 can be exposed for removal in the following operation.

Referring to FIG. 2, in operation 222, the etched polysilicon layer is removed. For the fin structure that includes the first-type nanostructures and the second-type nanostructures, the first-type nanostructures of the fin structure are also removed. For example, as shown in FIGS. 13A and 13B, etched polysilicon layer 402 is removed to form polysilicon opening 1302. As shown in FIG. 13B, first-type nanostructures 302 of fin structure 106 are removed to form first-type nanostructure openings 1304. Removal of etched polysilicon layer 402 and first-type nanostructures 302 can be achieved using a dry etching process (e.g., reactive ion etching) or a wet etching process, each having a higher etching rate towards etched polysilicon layer 402 and first-type nanostructures 302 and a lower etching rate towards fin structure 106, spacer 114, and inner spacers 114A. In some embodiments, the gas etchants used in the dry etching process can include Cl, F, bromine (Br), and a combination thereof. In some embodiments, an ammonium hydroxide ($NH_4OH$), sodium hydroxide (NaOH), or potassium hydroxide (KOH) wet etching can be used to remove etched polysilicon layer 402 and first-type nanostructures 302.

Figure 14A:
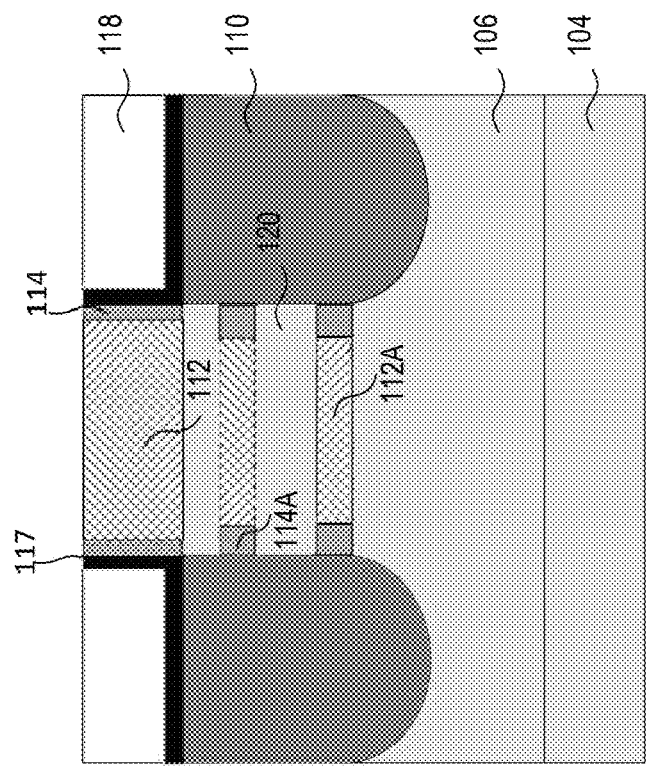
Figure 14B:
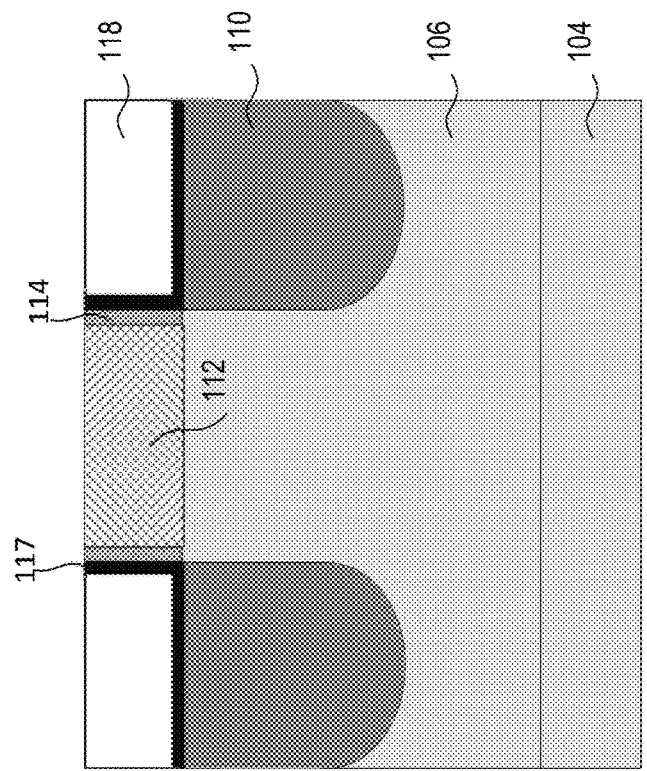

Referring to FIG. 2, in operation 224, a modulated gate structure is formed in the space previously occupied by the etched polysilicon layer. For the fin structure that includes the first-type nanostructures and the second-type nanostructures, gate layers are also formed in the space previously occupied by the first-type nanostructures. For example, as shown in FIGS. 14A and 14B, modulated gate structures 112 are formed in polysilicon openings 1302. As shown in FIG. 14B, gate layers 112A are also formed in first-type nanostructure openings 1304. Gate structures 112 and 112A can include a multi-layered structure with IO layer, HK gate dielectric layer, WFM layer, and gate metal fill layer. These layers are not shown in FIGS. 14A and 14B for simplicity. The IO layer can be deposited using PECVD, CVD, or ALD. The HK gate dielectric layer can be deposited using PECVD, CVD, PVD, or ALD. The WFM layer can be deposited by PECVD, CVD, PVD, ALD, metal organic chemical vapor deposition (MOCVD), sputtering, other suitable deposition methods, and a combination thereof. The gate metal fill layer can be formed by PECVD, CVD, PVD, ALD, MOCVD, sputtering, other suitable deposition methods, and a combination thereof. Because gate structures 112 have a modulated arrangement and S/D regions 110 are aligned to spacer 114 above fin top surface $106_T$, the distance between S/D regions 110 and modulated gate structures 112 is greater than the case where the gate structure does not have a modulated arrangement. The increased distance between S/D regions 110 and modulated gate structures 112 can reduce Isof, DIBL, Cgc, and Cgd, which in turn reduces device failures, increases device reliability, increases device speed, and improves device performance.

The present disclosure provides example FET devices (e.g., FET 100, GAA FETs, finFETs, or planar FETs) with modulated gate structures (e.g., gate structures 112) in a semiconductor device and/or in an IC and an example method (e.g., method 200) for fabricating the same. Modulated gate structures can be gate structures having varying lengths at different portions. For example, a first portion of the modulated gate structure above a top surface of a fin structure can be wider than a second portion of the modulated gate structure below the top surface of the fin structure. In some embodiments, a polysilicon layer (e.g., polysilicon layer 402) can be blanket deposited on the fin structure (e.g., fin structure 106). A photoresist mask layer (e.g., photoresist mask layer 502) can be formed on the polysilicon layer. The polysilicon layer not covered by the photoresist mask layer and above the top surface of the fin structure can be etched using a first etching condition. The polysilicon layer not covered by the photoresist mask layer and below the top surface of the fin structure can be etched using a second etching condition. The different etching conditions can result in a narrower etched polysilicon layer below the fin top surface than the etched polysilicon layer above the fin top surface. A spacer (e.g., gate spacer 114) can be formed on the etched polysilicon layer. S/D regions (e.g., S/D regions 110) can be formed aligning to the spacer above the fin top surface. The etched polysilicon layer can be removed and a gate structure can be formed in a space previously occupied by the etched polysilicon layer. Because S/D regions are aligned to the spacer above the fin top surface and the modulated gate structure is narrower below the fin top surface than above the fin top surface, the distance between the S/D regions and the modulated gate structure below the fin top surface is extended. Leakage current can be reduced, resulting in a more reliable device. Cgc and Cgd can also be reduced, resulting in faster device speed. The modulated gate structure process can also be performed on fin structures with first-type nanostructures and second-type nanostructures.

In some embodiments, a method includes forming a fin structure on a substrate and depositing a polysilicon layer over the fin structure. The method further includes forming a photoresist mask layer on the polysilicon layer, where the photoresist mask layer covers a first portion of the polysilicon layer and exposes a second portion of the polysilicon layer. The method further includes etching, with a first etching condition, the second portion of the polysilicon layer above a top surface of the fin structure to form a top portion of a polysilicon structure. The method further includes etching, with a second etching condition, the first and second portions of the polysilicon layer below the top surface of the fin structure to form a bottom portion of the polysilicon structure, where the bottom portion of the polysilicon structure is narrower than the top portion of the polysilicon structure. The method further includes removing the polysilicon structure to form a space and forming a gate structure in the space.

In some embodiments, a method includes forming a fin structure on a substrate, and depositing a polysilicon layer over the fin structure, where the polysilicon layer comprises a first portion and a second portion. The method further includes etching, with a first etching condition, the second portion of the polysilicon layer above a top surface of the fin structure, where the etched polysilicon layer above the top surface of the fin structure has a first width. The method further includes etching, with a second etching condition, the first and second portions of the polysilicon layer below the top surface of the fin structure, where the etched polysilicon layer below the top surface of the fin structure has a second width less than the first width. The method further includes forming a spacer on the etched polysilicon layer and forming a source/drain (S/D) region on the fin structure adjacent to the etched polysilicon layer. The method further includes forming a gate structure, including removing the etched polysilicon layer to form a space and forming the gate structure in the space.

In some embodiments, a semiconductor device includes a substrate, a fin structure on the substrate, and a gate structure on the fin structure, where a first portion of the gate structure above a top surface of the fin structure is wider than a second portion of the gate structure below the top surface of the fin structure. The semiconductor device further includes a source/drain (S/D) region on a portion of the fin structure adjacent to the gate structure and a spacer between the gate structure and the S/D region.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin structure on a substrate;
   depositing a polysilicon layer over the fin structure;
   forming a photoresist mask layer on the polysilicon layer, wherein the photoresist mask layer covers a first portion of the polysilicon layer and exposes a second portion of the polysilicon layer;
   etching, with a first etching condition, the second portion of the polysilicon layer above a top surface of the fin structure to form a top portion of a polysilicon structure;
   etching, with a second etching condition, the first and second portions of the polysilicon layer below the top surface of the fin structure to form a bottom portion of the polysilicon structure, wherein the bottom portion of the polysilicon structure is narrower than the top portion of the polysilicon structure;
   forming a spacer on the polysilicon structure;
   depositing an etch stop layer (ESL) on the spacer;
   removing the polysilicon structure to form a space; and
   forming a gate structure in the space.

2. The method of claim 1, wherein the fin structure comprises one or more first-type nanostructures and one or more second-type nanostructures, further comprising:
   removing the one or more first-type nanostructures to form an other space; and
   forming one or more gate layers in the other space.

3. The method of claim 1, wherein etching the first and second portions of the polysilicon layer below the top surface of the fin structure comprises transitioning the first etching condition to the second etching condition by tuning a flow of a passivation gas, wherein the passivation gas comprises nitrogen ($N_2$), oxygen ($O_2$), and a combination thereof.

4. The method of claim 1, wherein etching the first and second portions of the polysilicon layer below the top surface of the fin structure comprises increasing an etching power associated with the first etching condition.

5. The method of claim 1, further comprising:
   removing a portion of the fin structure adjacent to the polysilicon structure; and
   forming a source/drain (S/D) region in the removed portion of the fin structure.

6. The method of claim 5, wherein forming the spacer in the polysilicon structure further comprises aligning the S/D region is aligned to the spacer above the top surface of the fin structure, wherein a first distance between the S/D region and the gate structure below the top surface of the fin structure is greater than a second distance between the S/D region and the gate structure above the top surface of the fin structure.

7. The method of claim 6, further comprising:
depositing the etch stop layer (ESL) on the S/D region; and
depositing an interlayer dielectric (ILD) layer on the ESL.

8. The method of claim 1, wherein a ratio of a first length of the gate structure above the top surface of the fin structure to a second length of the gate structure below the top surface of the fin structure is between about 1.5 and about 3.

9. The method of claim 1, wherein a sidewall of the gate structure below the top surface of the fin structure is substantially straight or curved.

10. The method of claim 1, wherein forming the gate structure in the space comprises:
depositing an interfacial oxide (IO) layer in the space;
depositing a high-k (HK) gate dielectric layer on the IO layer;
depositing a work function metal (WFM) layer on the HK gate dielectric layer; and
depositing a gate metal fill layer on the WFM layer.

11. A method, comprising:
forming a fin structure on a substrate, wherein the fin structure comprises one or more first-type nanostructures;
depositing a polysilicon layer over the fin structure, wherein the polysilicon layer comprises a first portion and a second portion;
etching, with a first etching condition, the second portion of the polysilicon layer above a top surface of the fin structure, wherein the etched polysilicon layer above the top surface of the fin structure has a first width;
etching, with a second etching condition, the first and second portions of the polysilicon layer below the top surface of the fin structure, wherein the etched polysilicon layer below the top surface of the fin structure has a second width less than the first width;
forming a spacer on the etched polysilicon layer;
forming an inner spacer at ends of each of the one or more first-type nanostructures;
forming a source/drain (S/D) region on the fin structure adjacent to the etched polysilicon layer; and
forming a gate structure, comprising:
removing the etched polysilicon layer to form a space;
removing the one or more first-type nanostructures to form an other space; and
forming the gate structure in the space and in the other space.

12. The method of claim 11, wherein forming the gate structure comprises forming one or more gate layers in the other space.

13. The method of claim 11, wherein etching the first and second portions of the polysilicon layer below the top surface of the fin structure comprises transitioning the first etching condition to the second etching condition by tuning a flow of a passivation gas, wherein the passivation gas comprises nitrogen ($N_2$), oxygen ($O_2$), and a combination thereof.

14. The method of claim 11, wherein the S/D region is aligned to the spacer above the top surface of the fin structure, and a first distance between the S/D region and the gate structure below the top surface of the fin structure is greater than a second distance between the S/D region and the gate structure above the top surface of the fin structure.

15. The method of claim 11, wherein a ratio between a first length of the gate structure above the top surface of the fin structure and a second length of the gate structure below the top surface of the fin structure is between about 1.5 and about 3.

16. The method of claim 11, wherein a sidewall of the gate structure below the top surface of the fin structure is substantially straight or curved.

17. A method, comprising:
alternately depositing a plurality of nanosheet channel layers and a plurality of sacrificial layers on a substrate;
forming a gate structure surrounding the plurality of nanosheet channel layers, wherein forming the gate structure comprises:
depositing a polysilicon layer over the plurality of nanosheet channel layers;
etching a first portion of the polysilicon layer with a first etching condition, wherein the first portion is above a top surface of an uppermost nanosheet channel layer of the plurality of nanosheet channel layers and wherein the first portion has a first width;
etching the first portion and a second portion of the polysilicon layer with a second etching condition, wherein the second portion of the polysilicon layer is below a top surface of an uppermost nanosheet channel layer of the plurality of nanosheet channel layers, wherein the second portion has a second width less than the first width;
depositing a spacer on the etched polysilicon layer;
forming an inner spacer at ends of each of the plurality of sacrificial layers;
etching the etched polysilicon layer to form a first opening;
etching the plurality of sacrificial layers to form a second opening; and
depositing gate layers within the first opening and the second opening.

18. The method of claim 17, further comprising forming a source/drain (S/D) region adjacent to the gate structure, wherein the S/D region is aligned to the spacer, and wherein a first distance between the S/D region and the gate structure below the uppermost nanosheet channel layer of the plurality of nanosheet channel layers is greater than a second distance between the S/D region and the gate structure above the uppermost nanosheet channel layer of the plurality of nanosheet channel layers.

19. The method of claim 18, further comprising:
depositing an etch stop layer (ESL) on the S/D region; and
depositing an interlayer dielectric (ILD) layer on the ESL.

20. The method of claim 17, further comprising:
depositing a photoresist layer on the polysilicon layer; and
patterning the photoresist layer to protect a third portion of the polysilicon layer during etching the first portion and second portion of the polysilicon layer.

* * * * *